(12) United States Patent
Chen et al.

(10) Patent No.: US 11,955,374 B2
(45) Date of Patent: Apr. 9, 2024

(54) METHOD FOR FORMING SOI SUBSTRATE

(71) Applicant: Taiwan Semiconductor Manufacturing Company, Ltd., Hsinchu (TW)

(72) Inventors: Chi-Ming Chen, Hsinchu County (TW); Eugene I-Chun Chen, Taipei (TW); Chia-Shiung Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 285 days.

(21) Appl. No.: 17/460,290

(22) Filed: Aug. 29, 2021

(65) Prior Publication Data

US 2023/0062601 A1 Mar. 2, 2023

(51) Int. Cl.
*H01L 21/762* (2006.01)
*H01L 21/02* (2006.01)

(52) U.S. Cl.
CPC .............................. *H01L 21/76254* (2013.01)

(58) Field of Classification Search
CPC ......... H01L 21/76254; H01L 21/76275; H01L 21/02002
See application file for complete search history.

(56) References Cited

U.S. PATENT DOCUMENTS

| | | | |
|---|---|---|---|
| 2007/0246752 A1 | 10/2007 | Cheng et al. | |
| 2008/0064182 A1* | 3/2008 | Hebras | H01L 21/76254 438/455 |
| 2009/0269875 A1* | 10/2009 | Kato | H01L 31/076 438/58 |
| 2011/0201176 A1* | 8/2011 | Ramappa | H01L 21/76254 257/E21.568 |
| 2012/0097868 A1* | 4/2012 | Dickerson | H01L 21/26506 250/492.3 |
| 2017/0243781 A1* | 8/2017 | Peidous | H01L 29/40117 |
| 2017/0345709 A1* | 11/2017 | Malaquin | H01L 21/76254 |
| 2019/0202688 A1* | 7/2019 | Benaissa | H01L 21/76254 |
| 2020/0152505 A1* | 5/2020 | Ishizuka | H01L 21/76254 |
| 2021/0225695 A1 | 7/2021 | Schwarzenbach et al. | |
| 2022/0298007 A1* | 9/2022 | Salvetat | B81C 1/00182 |

FOREIGN PATENT DOCUMENTS

TW 200710947 3/2007

OTHER PUBLICATIONS

"Office Action of Taiwan Counterpart Application", dated Oct. 26, 2022, p. 1-p. 8.

* cited by examiner

*Primary Examiner* — Mohsen Ahmadi
(74) *Attorney, Agent, or Firm* — JCIPRNET

(57) ABSTRACT

A method of forming a semiconductor-on-insulator (SOI) substrate includes: forming a first dielectric layer on a first substrate; forming a buffer layer on a second substrate; forming a semiconductor cap on the buffer layer over the second substrate; forming a cleavage plane in the buffer layer; forming a second dielectric layer on the semiconductor cap after forming the cleavage plane; bonding the second dielectric layer on the second substrate to the first dielectric layer on the first substrate; performing a splitting process along the cleavage plane in the buffer layer; removing a first split buffer layer from the semiconductor cap; and removing a second split buffer layer from the second substrate.

20 Claims, 9 Drawing Sheets

METHOD FOR FORMING SOI SUBSTRATE

BACKGROUND

Conventional semiconductor-on-insulator (SOI) substrate typically has a thin layer of silicon, also known as the active layer, on an insulator layer such as a buried oxide (BOX) layer. Devices formed on SOI substrates exhibit many improved performance characteristics over their bulk substrate counterparts. SOI substrates are particularly useful in reducing problems relating to reverse body effects, device latch-up, soft-error rates, and junction capacitance. SOI technology therefore enables higher speed performance, higher packing density, and reduced power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
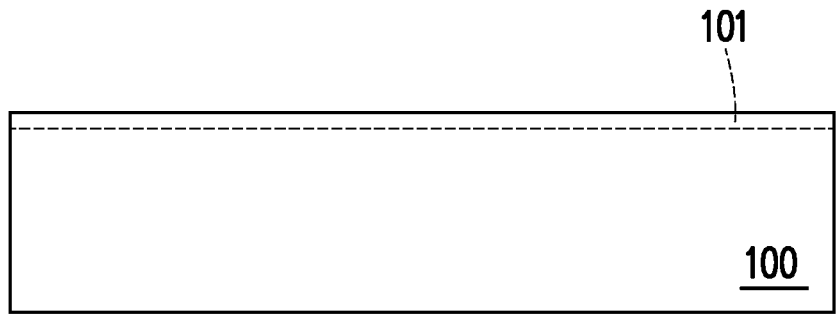
FIG. 1A and FIG. 1B are cross-sectional views illustrating a preparation of a wafer structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 4D and FIG. 5B are cross-sectional views illustrating a method of forming a semiconductor structure, according to some embodiments of the disclosure, the method includes various intermediate stages in the manufacturing of a semiconductor-on-insulator (SOI) substrate. FIG. 1A and FIG. 1B are cross-sectional views illustrating a preparation of an initial wafer structure for forming a SOI substrate in accordance with some embodiments of the disclosure.

Referring to FIG. 1A, a substrate 100 is provided. In some embodiments, the substrate 100 is a semiconductor substrate. Fox example, the substrate 100 is semiconductor wafer, such as a silicon wafer. The substrate 100 may include monocrystalline silicon. In some embodiments, the substrate 100 may also be referred to as a carrier substrate. The substrate 100 may be lightly doped. For example, the substrate 100 is a p-type ($p^-$) substrate including p-type dopants such as boron or $BF_2^+$, but the disclosure is not limited thereto. In some alternative embodiments, the substrate 100 may be lightly doped with n-type dopants such as phosphorus or arsenic. In some embodiments, the substrate 100 may have high resistivity.

In some embodiments, a polysilicon layer 101 may be formed on as a top portion of the substrate 100. The polysilicon layer 101 is optionally formed depending on product design and requirement. For example, a polysilicon layer 101 having a high resistivity may be formed over high resistivity monocrystalline silicon for advanced RF applications. The forming method of the polysilicon layer 101 may include a deposition process such as chemical vapor deposition (CVD), an epitaxial process, or a combination thereof, for example. In some embodiments, the thickness of the polysilicon layer 101 may range from 0.2 µm to 2 µm, or 0.5 µm to 1 µm. It is noted, the polysilicon layer 101 is illustrated as dotted line to represent that is might be omitted in some embodiments.

Figure 1B:
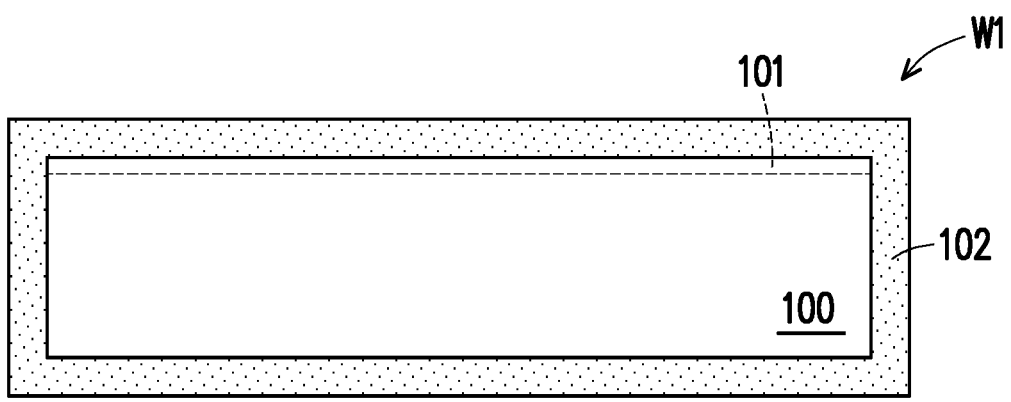

Referring to FIG. 1B, in some embodiments, a dielectric layer 102 is formed on surfaces of the substrate 100. The dielectric layer 102 may include an oxide, such as silicon oxide. The forming method of the dielectric layer 102 may include a thermal oxidation process. In some embodiments, the dielectric layer 102 wraps all around the substrate 100. As shown in FIG. 1B, the dielectric layer 102 covers the top surface, bottom surface and sidewalls of the substrate 100. In some embodiments, the thickness of the dielectric layer 102 ranges from 0.5 µm to 5.0 µm, for example.

As such, a wafer structure W1 including the substrate 100 and the dielectric layer 102 is thus formed. The wafer structure W1 may further include the polysilicon layer 101 on the substrate 100 and covered by the dielectric layer 102. In some embodiments, the wafer structure W1 may also be referred to as an initial wafer structure.

FIG. 2A to FIG. 2D are cross-sectional views illustrating a preparation of another initial wafer structure for forming a SOI substrate in accordance with some embodiments of the disclosure.

Figure 2A:
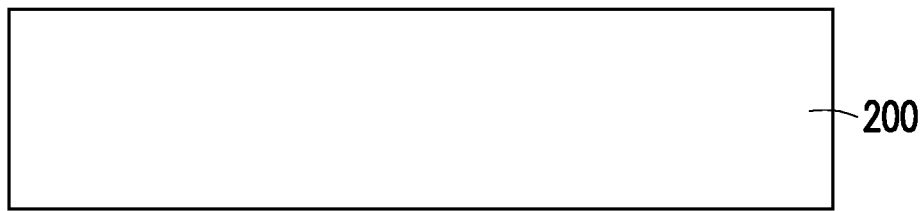
FIG. 2A to FIG. 2D are cross-sectional views illustrating a preparation of another wafer structure in accordance with some embodiments of the disclosure.

Referring to FIG. 2A, a substrate 200 is provided. In some embodiments, the substrate 200 is a semiconductor substrate. For example, the substrate 200 is semiconductor wafer, such as a silicon wafer. The substrate 200 may include monocrystalline silicon. The substrate 200 may be lightly doped. In some embodiment, the substrate 200 is a p-type (P$^-$) substrate including p-type dopants such as boron or BF$_2^+$, but the disclosure is not limited thereto. In some alternative embodiments, the substrate 200 may be an n-type substrate including n-type dopants such as phosphorus or arsenic.

Figure 2B:
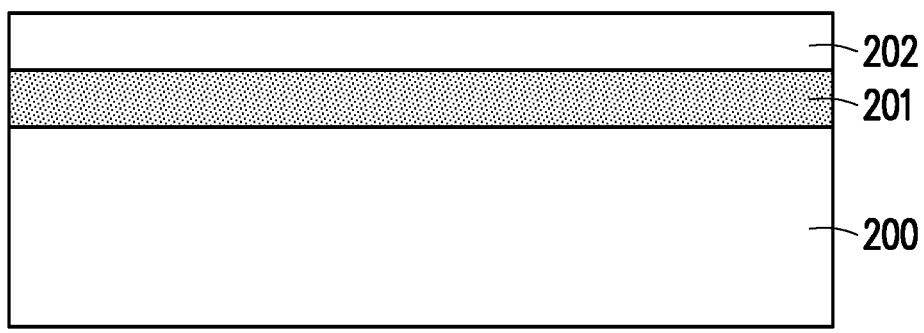

Referring to FIG. 2B, in some embodiments, a buffer layer 201 is formed on the substrate 200. The buffer layer 201 includes semiconductor material(s), and may include elements selected from group IIIA, group IVA. The forming method of the buffer layer 201 may include an epitaxial process, and the buffer layer 201 may also be referred to as an epitaxial layer. In some embodiments, the buffer layer 201 is a silicon germanium (SiGe) layer which may be undoped or doped. In some embodiments, the buffer layer 201 is a silicon germanium layer doped with boron (SiGe: B). In some embodiments in which the buffer layer 201 is doped silicon germanium layer, the buffer layer 201 may further include a diffusion inhibitor for inhibiting or reducing the diffusion of the dopant included in the buffer layer 201 from the buffer layer 201 to adjacent layers (such as the substrate 200, or the subsequently formed semiconductor cap 202). In some embodiments, the diffusion inhibitor may include carbon. For example, the buffer layer 201 is a silicon germanium layer doped with boron and carbon (SiGeC:B), wherein carbon serves as the diffusion inhibitor to inhibit or prevent the diffusion of boron from the buffer layer 201 to adjacent layers.

In some embodiments, the content of germanium in the buffer layer 201 may range from 25% to 30%. In some embodiments in which the buffer layer 201 includes boron, the concentration of boron may be controlled in a suitable range. If the concentration of boron is too high, the boron included in the buffer layer 201 may be easily diffused into the substrate 200 or subsequently formed semiconductor cap during subsequent processes. In some embodiments, the concentration of boron may range from 1E20 to 3E20 at/cm$^3$. A suitable amount of boron doped in the buffer layer 201 is advantage for the subsequent process, which will be described in detail below. In some embodiments, a suitable amount of carbon doped in the buffer layer 201 may help to present or reduce the diffusion of boron. For example, the content of carbon in the buffer layer 201 may range from 0.5% to 2%. In some embodiments, the thickness of the buffer layer 201 may range from 30 nm to 100 nm. However, the disclosure is not limited thereto.

Still referring to FIG. 2B, in some embodiments, a semiconductor cap 202 is formed on the buffer layer 201 by an epitaxial process, for example. The semiconductor cap 202 may include silicon, such as monocrystalline silicon, and may also be referred to as a silicon cap. In some embodiments, the semiconductor cap 202 is undoped at this stage, but the disclosure is not limited thereto. In some embodiments, the thickness of the semiconductor cap 202 may range from 15 nm to 200 nm.

In some embodiments, the combination of the substrate 200 and the semiconductor cap 202 may also be referred to as a semiconductor substrate (or a semiconductor structure), and the semiconductor substrate includes the buffer layer 201 embedded therein.

Figure 2C:
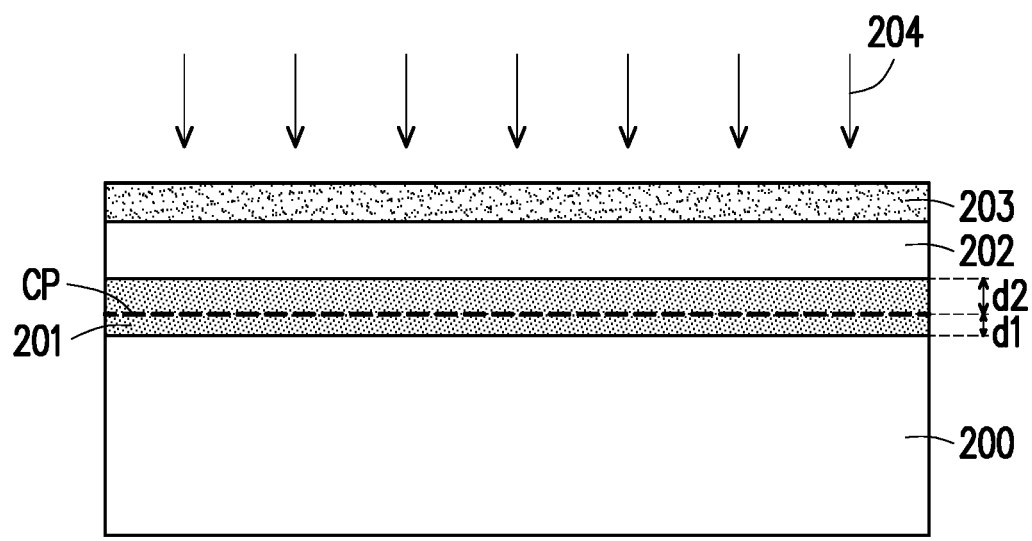

Referring to FIG. 2C, a sacrificial layer 203 is formed on the semiconductor cap 202. The sacrificial layer 203 may include a dielectric material, and may also be referred to as a sacrificial dielectric layer. In some embodiments, the sacrificial layer 203 includes an oxide, such as silicon oxide. The dielectric material may be amorphous. In some embodiments, the sacrificial layer 203 may be formed by a suitable deposition process, such as chemical vapor deposition (CVD). In some embodiments, the sacrificial layer 203 is formed by a low-temperature CVD process, and the deposition may be performed at a temperature lower than 350° C. or 400° C. In some embodiments, the thickness of the sacrificial layer 203 may range from 100 angstrom (Å) to 200 Å, but the disclosure is not limited thereto. The thickness of the sacrificial layer 203 may be adjusted based on the desired implantation depth of the subsequent implantation process.

In some embodiments, after the sacrificial layer 203 is formed, an implantation process 204 is performed to implant an implantation species through the sacrificial layer 203 and the semiconductor cap 202 into the buffer layer 201, so as to define a cleavage plane CP in the buffer layer 201. In some embodiments, hydrogen ions (H$^+$) are implanted into the buffer layer 201 to define the cleavage plane CP. In some embodiments, the hydrogen ions may be implanted through the sacrificial layer 203 and the semiconductor cap 202, and into the buffer layer 201. In alternative embodiments, other implantation species may be used, such as He$^+$, with the dose and energy being adjusted accordingly. During the implantation process, the semiconductor cap 202 may be protected by the sacrificial layer 203 from being damaged by the ion bombardment.

For example, the implantation process may be performed at energy of 5-100 KeV using a dosage (e.g., hydrogen dosage) of $3 \times 10^{16}$ ions/cm$^2$ to $1 \times 10^{17}$ ions/cm$^2$. In some embodiments, the implantation process is performed such that ions enter the projected layer (e.g., the sacrificial layer 203) at a non-right angle, such as a tilted angle with respect to the top surface of the sacrificial layer 203. For example, the tilted angle is larger than 0° and may range from 5° to 9°. However, the disclosure is not limited thereto. In alternative embodiments, the ions may enter the projected layer at a right angle.

In some embodiments, during the implantation process, the projected range of the implantation species may be within (e.g., mostly within) the buffer layer 201. Herein, "projected range" refers to depths range where the implantation species reached and stopped. Generally, the higher the implantation energy, the deeper the ions can penetrate into the projected layers. However, even with the same implantation energy, ions do not stop exactly at the same depth in the substrate because each ion has different collisions with different atoms. In some embodiments, the projected range has a distribution, such as a Gaussian distribution, in which ion concentrations normally distributed throughout the depth of the projected layers. In other words, the ions have a Gaussian distribution doping profile. Herein, "Gaussian distribution doping profile" refers to a doping concentration distribution in a direction, for example, perpendicular to the top surface of the substrate 200 following a Gaussian distribution profile. In some embodiments, the ion concentration distribution shows a portion of the Gaussian distribution curve.

In some embodiments, the peak of the ion distribution is within the buffer layer 201, and the cleavage plane CP may be defined at the peak location of ion distribution. In some embodiments, the entire distribution of the implantation species (ions) is located within the buffer layer 201. In alternative embodiments, ends of the ion distribution may extend to the semiconductor substrate 200, the semiconductor cap 202 and/or the sacrificial layer 203.

In other words, most of the ions are implanted into the buffer layer 201, and the implanted ions have a largest concentration in the buffer layer 201. In some embodiments, some of the ions may be implanted in the sacrificial layer 203, the semiconductor cap 202 and/or the substrate 200. In some embodiments, the thickness of the sacrificial layer 203 and the energy of the implantation process are controlled, such that all of or most of the ions are implanted into the buffer layer 201, and a few ions or almost no ion is implanted into the semiconductor cap 202 and/or the substrate 200. In particular, the implantation of ions in the semiconductor cap 202 is minimized. That is to say, the concentration of ions implanted in the buffer layer 201 is larger than the concentration of ions implanted in the sacrificial layer 203, the semiconductor cap 202, and/or the substrate 200. In some embodiments, the concentration of ions implanted in the semiconductor cap 202 is less than the concentration of ions implanted in the substrate 200.

In some embodiments, the implantation depth of the implantation process is between the level height of the bottom surface of the buffer layer 201 and the level height of the top surface of the buffer layer 201. Herein, the "implantation depth" refers to the maximum depth or an average depth of the projected range, or the peak location of the ion distribution. In some embodiments, the implantation depth is closer to the bottom surface of the buffer layer 201 than the implantation depth is to the top surface of the buffer layer 201.

Still referring to FIG. 2C, the cleavage plane CP is defined in the buffer layer 201 at a location having high concentration of implantation species (e.g, $H^+$). It is understood that, although the cleavage plane CP is illustrated as a dotted line, the cleavage plane CP may be a doped layer included in the buffer layer, the doped layer has a relative high concentration of implantation species and having a certain thickness. The cleavage plane CP may also be referred to as a cleavage layer. In some embodiments, the cleavage plane CP is closer to the substrate 200 than the cleavage plane CP is to the semiconductor cap 202. In other words, the vertical distance d1 between the cleavage plane CP and the bottom surface of the buffer layer 201 (or the top surface of the substrate 200) is less than the vertical distance d2 between the cleavage plane CP and the top surface of the buffer layer 201 (or the bottom surface of the semiconductor cap 202).

Figure 2D:
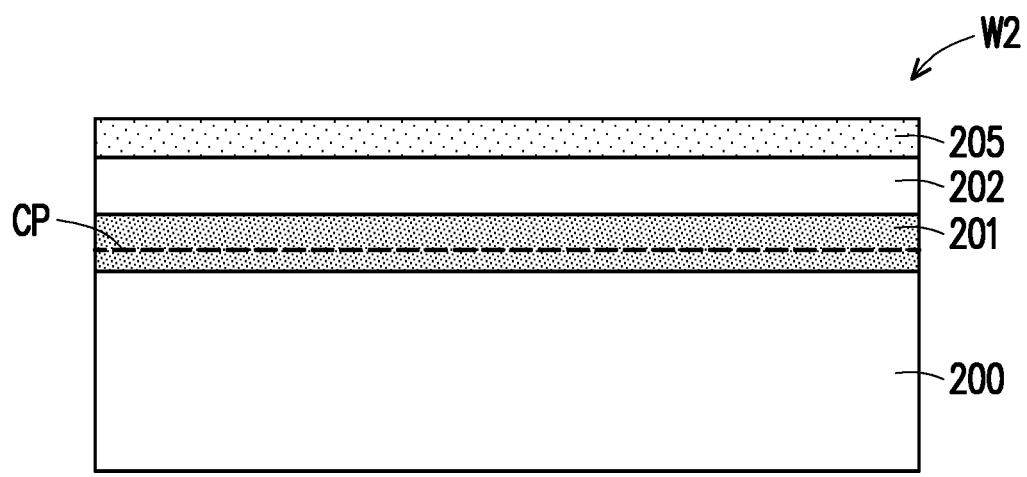

Referring to FIG. 2D, after the implantation process is performed, the sacrificial layer 203 is removed by an etching process, such as a wet etching, a dry etching, or combination thereof. In some embodiments, the sacrificial layer 203 is removed by a wet etching process using dilute HF (DHF).

Thereafter, a dielectric layer 205 is formed on the semiconductor cap 202. The material of the dielectric layer 205 may be the same as or different from the material of the removed sacrificial layer 203. The dielectric layer 205 may include an oxide such as silicon oxide. In some embodiments, the dielectric layer 205 includes low-charge dielectric layer and may be free of hydrogen. In some embodiments, the dielectric layer 205 is formed by a suitable deposition process such as CVD. The deposition process may be performed at a low temperature to prevent premature cleaving along cleavage plane CP, i.e., prior to the subsequent wafer bonding process. This cleaving temperature is a complex function of the implanted species, implanted dose, and implanted material. In some embodiments, premature cleaving may be avoided by maintaining a deposition temperature below approximately 350° C., for example. In some embodiments, the dielectric layer 205 is configured for the subsequent wafer bonding process, and may also be referred to as a bonding layer or a bonding dielectric layer. The thickness of the dielectric layer 205 may be the same as or different from the thickness of the dielectric layer 102. For example, the thickness of the dielectric layer 205 may range from 0.5 µm to 5.0 µm.

In the embodiments of the disclosure, the sacrificial dielectric layer 203 is formed on the semiconductor cap 202 before performing the implantation process, and the dielectric layer 205 is formed on the semiconductor cap 202 after the implantation process has been performed and after the sacrificial layer 203 is removed. Such a process has some advantages. During the implantation process, the sacrificial layer 203 may protect the semiconductor cap 202 from being damaged by directly ion bombardment. In some embodiments, implantation may damage the surface or the structure of the sacrificial layer 203. On the other hands, some of the implanted ions may be retained in the sacrificial dielectric layer 203. If the sacrificial dielectric layer 203 is remained on the semiconductor cap 202 for subsequent processes and used for a buried oxide layer of final SOI substrate, the damaged sacrificial layer 203 may adversely affect subsequent processes (e.g., wafer bonding) for forming the SOI substrate, and the implanted ions retained in the sacrificial layer 203 may adversely affect the quality of SOI substrate and the performance of devices formed on the SOI substrate. In the embodiments of the disclosure, since the damaged sacrificial layer 203 having implanted ions therein is removed, the above-described issues are avoided. Further, the dielectric layer 205 is formed after the implantation process has been performed, thereby avoiding the damage and metal contamination that may be caused by the implantation process. Also, the implantation species won't enter the dielectric layer 205, and the issues caused by implantation species in the dielectric layer are avoided. In other words, the dielectric layer 205 is free of implant included defect and is free of dopants or ions therein, which is benefit for the subsequent process and the quality of the resulted SOI substrate.

Still referring to FIG. 2D, in some embodiments, the substrate 200, the buffer layer 201, the semiconductor cap 202 and the dielectric layer 205 constitute a wafer structure W2. The wafer structure W2 may also be referred to as an initial wafer structure.

Figure 3A:
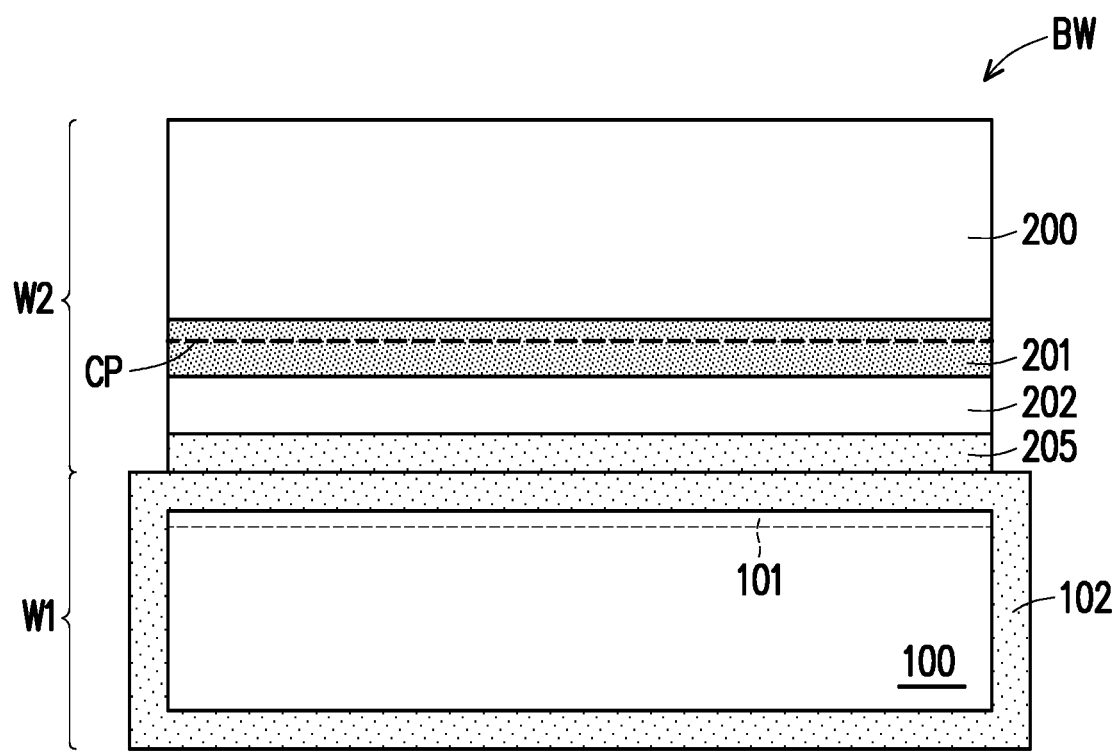
FIG. 3A and FIG. 3B are cross-sectional views illustrating intermediate stages including wafer bonding and wafer splitting in the manufacturing of a semiconductor-on-insulator (SOI) substrate in accordance with some embodiments of the disclosure.
Figure 3B:
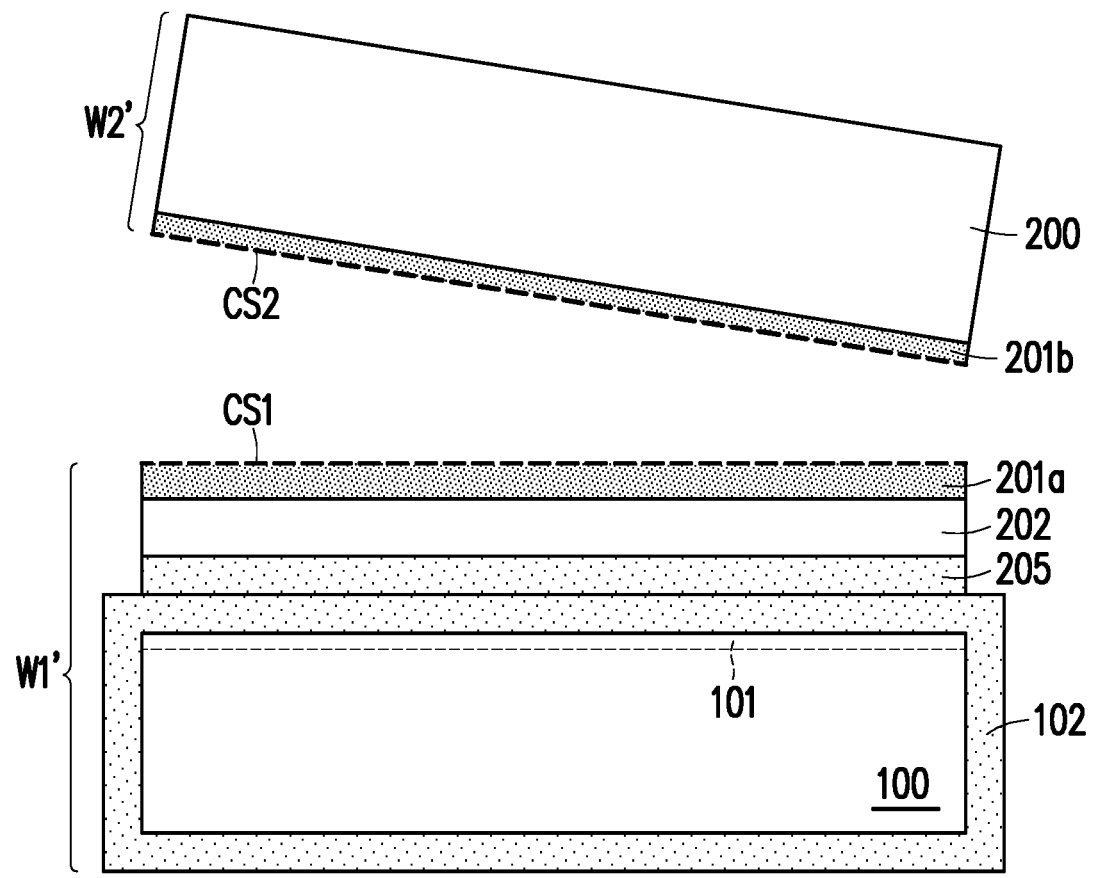

FIG. 3A and FIG. 3B are cross-sectional views illustrating intermediate stages including wafer bonding and wafer splitting in the manufacturing of a SOI substrate in accordance with some embodiments of the disclosure.

Referring to FIG. 3A, a wafer bonding process is performed to bond the wafer structure W2 to the wafer structure W1. In some embodiments, the wafer bonding process is performed by bonding the dielectric layer 205 of the wafer structure W2 to the dielectric layer 102 of the wafer structure W1. The wafer bonding process may include a fusion bonding process. For example, the bonding process may be performed as below: firstly, in order to avoid the occurrence of the unbonded areas (i.e. interface bubbles), the to-be-bonded surfaces of the wafer structure W2 and the wafer structure W1 (that is, the surfaces of the dielectric layers 205 and 102) are processed to be sufficiently clean and smooth. Then, the wafer structure W2 is flipped upside down, the dielectric layer 205 of the wafer structure W2 and the dielectric layer 102 of the wafer structure W1 are aligned and placed in physical contact at room temperature with slight pressure to initiate a bonding operation. Thereafter, a thermal treatment such as an annealing process at elevated temperatures is performed to strengthen the chemical bonds between the to-be-bonded surfaces of the wafer structure W2 and W1 and to transform the chemical bonds into covalent bonds. In some embodiments, the annealing process is performed at a temperature lower than that of the subsequent wafer splitting process, so as to prevent premature cleaving along cleavage plane CP, i.e., prior to the subsequent wafer splitting process. For example, the wafer bonding process may be performed at about 350° C. for about 2 hours.

Still referring to FIG. 3A, a bonded wafer structure BW including the wafer structure W2 and the wafer structure W1 is thus formed. In some embodiments, the bonded wafer structure BW includes the carrier substrate 100, the dielectric layer 102 surrounding the carrier substrate 100, and the dielectric layer 205, the semiconductor cap 202, the buffer layer 201 and the substrate 200 that are sequentially stacked on the dielectric layer 102 over the carrier substrate 100. In some embodiments, the size (e.g., width, area) of the wafer structure W2 may be substantially equal to the size of the substrate 100 of the wafer structure W1 and may be less than the overall size of the wafer structure W1. The sidewalls of the substrate 200, the buffer layer 201, the semiconductor cap 202 and the dielectric layer 205 of the wafer structure W2 may be substantially aligned with the sidewalls of the substrate 100 of the wafer structure W1. The dielectric layer 102 may laterally extends beyond sidewalls of the wafer structure W2 and covering sidewalls of the substrate 100. The bonded wafer structure BW includes a dielectric-to-dielectric bonding interface between the dielectric layer 205 of the wafer structure W2 and the dielectric layer 102 of the wafer structure W1.

Referring to FIG. 3A and FIG. 3B, thereafter, a wafer splitting process is performed to split the bonded wafer structure BW along the cleavage plane CP. In some embodiments, a split is induced at the cleavage plane CP by annealing the bonded wafer structure BW. In some embodiments in which the cleavage plane CP is defined by implanting hydrogen ions in the buffer layer 201, hydrogen forms gaseous bubbles inside of buffer layer 201 upon annealing, thereby creating a hydrogen exfoliation layer along the cleavage plane CP in the buffer layer 201. This split may be induced by an annealing process performed at about 400° C. to 600° C. for about 5-30 minute, and resulting in the formation of two separate wafer structures W1' and W2'.

In other words, the bonded wafer structure BW is split into two separate wafer structures W1' and W2' along the cleavage plane CP in the buffer layer 201. In some embodiments, the buffer layer 201 is split into a buffer layer 201a included in the wafer structure W1' and a buffer layer 201b included in the wafer structure W2'. The buffer layers 201a and 201b may also be referred to as split buffer layers. In some embodiments, since the cleavage plane CP is closer to the substrate 200 than the cleavage plane CP is to the semiconductor cap 202, the thickness of the split buffer layer 201b on the substrate 200 may be less than the thickness of the split buffer layer 201a on the semiconductor cap 202. In some embodiments, the wafer splitting may be induced by mechanical force in addition to or instead of annealing. In some embodiments, after the buffer layer 201 is split into buffer layers 201a and 201b, the cleavage surfaces CS1 and CS2 of the buffers layer 201a and 201b may be uneven due to bubbles.

Referring to FIG. 3B, after the wafer splitting process, a wafer structure W1' and a wafer structure W2' are formed. The wafer structure W1' includes the substrate 100, the dielectric layer 102, the dielectric layer 205, the semiconductor cap 202 and the buffer layer 201a. The dielectric layer 102 surrounds top and bottom surfaces and sidewalls of the substrate 100. The dielectric layer 205 is disposed on the dielectric layer 102, and a dielectric-to-dielectric bonding interface is existed between the dielectric layer 102 and the dielectric layer 205. The semiconductor cap 202 is disposed on the dielectric layer 205, and the buffer layer 201a is disposed on the semiconductor cap 202. The wafer structure W2' may include the substrate 200 and the buffer layer 201b on the substrate 200. In other words, through the wafer bonding process and the wafer splitting process, the dielectric layer 205, the semiconductor cap 202 and the buffer layer 201a are transferred from the wafer structure W2 to the wafer structure W1.

Thereafter, the wafer structure W1' and the wafer structure W2' are separately processed to form a SOI substrate and a bulk substrate.

Figure 4A:
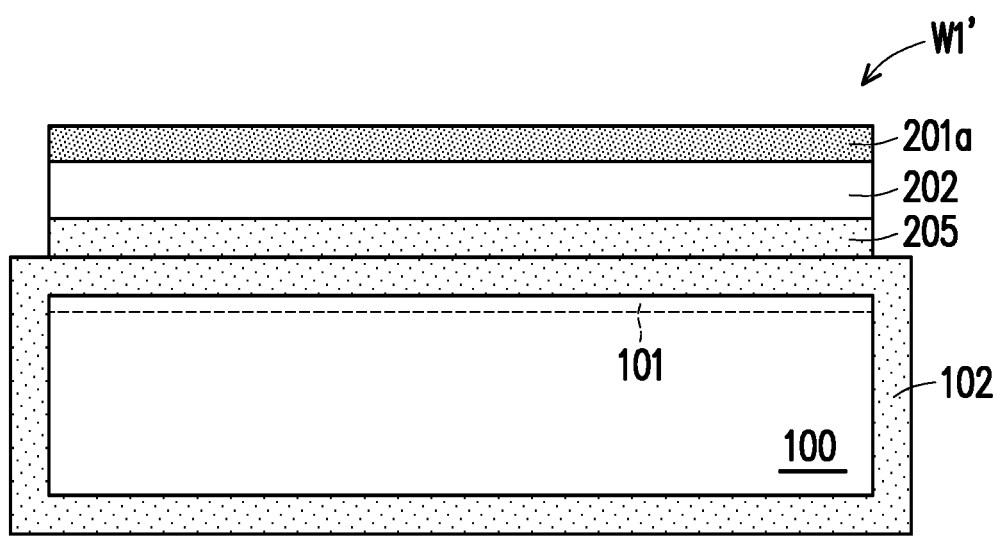
FIG. 4A to FIG. 4C are cross-sectional views illustrating intermediate stages in the manufacturing of a SOI substrate following the process of wafer splitting, in accordance with some embodiments of the disclosure.
Figure 4B:
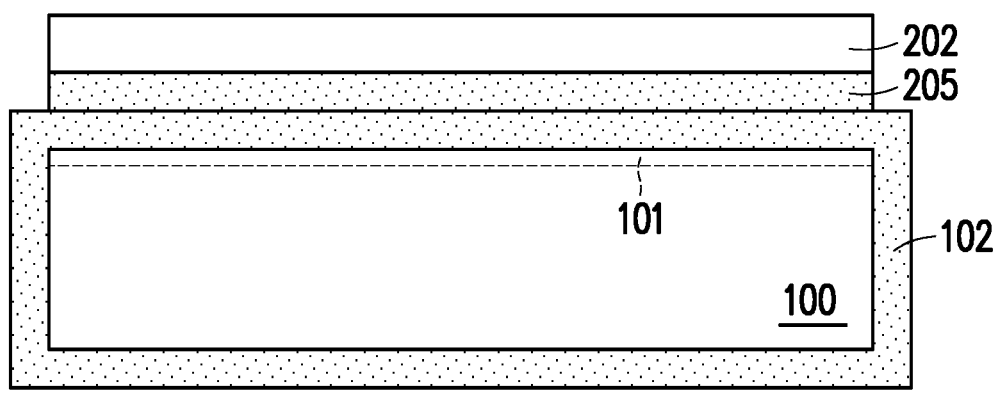
Figure 4C:
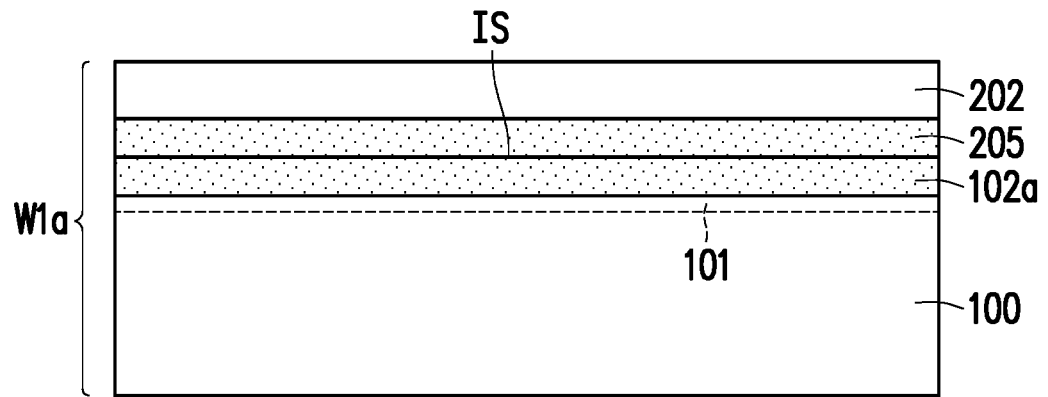
Figure 4D:
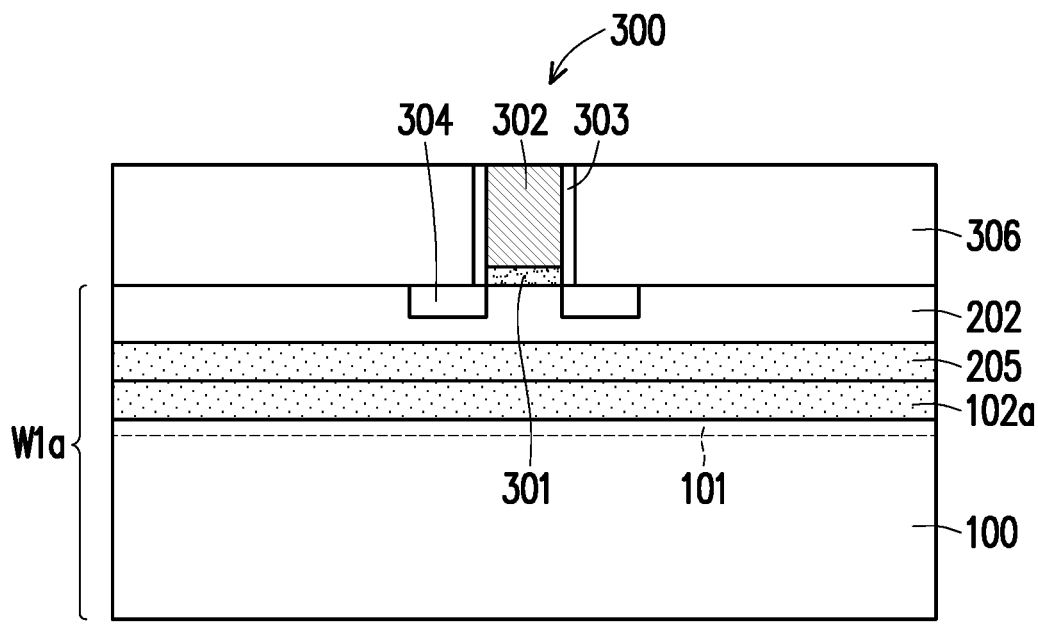
FIG. 4D is a cross-sectional view illustrating a semiconductor structure including devices formed on a SOI substrate.

FIG. 4A to FIG. 4C are cross-sectional views illustrating intermediate stages in the manufacturing of a SOI substrate following the process of wafer splitting, in accordance with some embodiments of the disclosure. FIG. 4D is a cross-sectional view illustrating a semiconductor structure including devices formed on a SOI substrate.

Referring to FIG. 4A, in some embodiments, after the wafer splitting process, an annealing process is performed on the wafer structure W1'. The annealing process may also be referred to as a post annealing process and may be performed under a temperature ranging from 1100° C. to 1150° C. for about 0.5 to 5 hours. In some embodiments, the annealing process is performed such that all implant induced defects that may be included in the semiconductor cap 202 are healed. In some embodiment, after the annealing process, the semiconductor cap 202 is free of implantation species (dopants or ions such as hydrogen ions). In some embodiments, the implant induced defects (e.g., defects caused by hydrogen bubbles, such as uneven surface) included in the buffer layer 201a may be not completely eliminated by the annealing.

Referring to FIG. 4A and FIG. 4B, thereafter, the buffer layer 201a is removed from the wafer structure W1' by etching process, such as dry etching, wet etching, or a combination thereof. In some embodiments, the etchant used for etching the buffer layer 201a may include HF, $H_2O_2$, $CH_3COOH$, or combinations thereof. As such, the top surface of the semiconductor cap 202 is exposed. In some embodiments, a suitable amount of boron doped in the buffer layer 201 may help to increase the etching selectivity ratio between the buffer layer 201a and the semiconductor cap 202, thereby facilitate the conduction of the etching process. For example, without boron, the etching selectivity ratio between the buffer layer 201 and the semiconductor cap 202 may range from 20 to 30, while with boron doped in the buffer layer 201, the etching selectivity ratio between the buffer layer 201 and the semiconductor cap 202 may be increased to be larger than 100. A planarization process may further be performed to planarize the top surface of the semiconductor cap 202. The planarization process may include chemical mechanical polishing (CMP), for example.

Referring to FIG. 4B and FIG. 4C, in some embodiments, a portion of the dielectric layer 102 covering sidewalls and bottom surface of the substrate 100 may be removed, and a dielectric layer 102a is formed. The sidewalls and the bottom surface of the substrate 100 are exposed. The dielectric layer 102a is sandwiched between the dielectric layer 205 and the substrate 100, and a dielectric-to-dielectric bonding interface IS is existed between the dielectric layer 102a and the dielectric layer 205. The combination of the dielectric layer 102a and the dielectric layer 205 may also be referred to as a dielectric bonding structure. In some embodiments, the sidewalls of substrate 100, the dielectric layer 102a, the dielectric layer 205 and the semiconductor cap 202 are substantially aligned with each other.

Referring to FIG. 4C, a wafer structure W1a is thus formed. The wafer structure W1a includes the substrate 100, the dielectric bonding structure including the dielectric layers 102a and 205, and the semiconductor cap 202. The wafer structure W1a may also be referred to as a semiconductor-on-insulator (SOI) substrate. The dielectric bonding structure may also be referred to as a buried oxide layer of the SOI substrate. The semiconductor cap 202 may also be referred to as device semiconductor layer for forming devices thereon and/or therein.

Referring to FIG. 4D, for example, a transistor 300 may be formed on/in the semiconductor cap 202. The transistor 300 may be metal-oxide-semiconductor field-effect transistor (MOSFET), or fin-type field-effect transistor (FinFET). In some embodiments, the transistor 300 may include a gate 302, a gate dielectric layer 301, spacers 303 and source/drain regions 304.

The gate dielectric layer 301 is formed on the semiconductor cap 202 and disposed between the gate 302 and the semiconductor cap 202. The gate dielectric layer 11 may include silicon oxide, silicon nitride, silicon oxynitride, high-k dielectric materials, or combinations thereof. The high-k material may have a dielectric constant greater than about 4 or 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfiO, a combination thereof, or a suitable material.

The gate (or referred to as gate electrode) 302 is disposed over the semiconductor cap 205 and separated from the semiconductor cap 205 by the gate dielectric layer 11 therebetween. The gate 303 may include doped polysilicon, undoped polysilicon, or metal-containing conductive material, such as copper, aluminum, tungsten, or other suitable metallic materials.

The spacers 303 may be disposed to cover sidewalls of the gate dielectric layer 301 and the gate 302. In some embodiments, the spacer 303 includes $SiO_2$, SiN, SiCN, SiOCN, SiC, SiOC, SiON, or the like, or combinations thereof.

The source/drain regions 304 are formed in the semiconductor cap 205 of the SOI substrate W1a and on sides of the gate 302. A channel region is defined in the semiconductor cap 202 between the source/drain regions 304 and underlying the gate 302. In some embodiments, the source/drain regions 304 are doped regions configured for a p-type MOSFET or FinFET and include p-type dopants, such as boron, $BF^{2+}$, and/or a combination thereof. In alternative embodiments, the source/drain regions 304 are doped regions configured for a n-type MOSFET or FinFET, and include n-type dopants, such as phosphorus, arsenic, and/or a combination thereof. However, the disclosure is not limited thereto. In some other embodiments, the source/drain regions 304 are strained layers (or referred to as epitaxial layers) formed by epitaxial growing process such as selective epitaxial growing process. In some embodiments, the strained layers include silicon germanium (SiGe), SiGeB, Ge, InSb, GaSb, InGaSb or combinations thereof for a p-type MOSFET or FinFET device. In alternative embodiments, the strained layers include silicon carbon (SiC), silicon phosphate (SiP), SiCP, InP, GaAs, AlAs, InAs, InAlAs, InGaAs or a SiC/SiP multi-layer structure, or combinations thereof for an n-type MOSFET or FinFET device. In some embodiments, the strained layers may be optionally implanted with an n-type dopant or a p-type dopant as needed.

In some embodiments, the top surfaces of the source/drain regions 304 may be substantially coplanar with the top surface of the semiconductor cap 205. In some other embodiments, the source/drain regions 304 may extend upwardly along the sidewalls of the corresponding spacers 303, and have top surfaces higher than the top surface of the semiconductor cap 205.

In some embodiments, a dielectric layer 306 is formed on the semiconductor cap 202 of the SOI substrate and laterally aside the gate 302 of the transistor 300. The dielectric layer 306 may include silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 306 may include low-k dielectric material with a dielectric constant lower than 4, extreme low-k (ELK) dielectric material with a dielectric constant lower than 2.5. In some embodiments, the low-k material includes a polymer based material, such as benzocyclobutene (BCB), FLARE®, or SILK®; or a silicon dioxide based material, such as hydrogen silsesquioxane (HSQ) or SiOF. The dielectric layer 306 may be formed by a suitable deposition process (e.g., CVD) followed by a planarization process (e.g., CMP). In some embodiments, the top surface of the dielectric layer 306 is substantially level/coplanar with the top surface of the gate 302.

In the embodiments of the disclosure, the semiconductor cap 202 (i.e., device layer of SOI substrate) is formed by epitaxial process and is not subjected to a czochralski process, compared to conventional SOI substrate including semiconductor cap formed from semiconductor wafer that was subjected to a czochralski process, the semiconductor cap 202 is free of crystal originated particle (COP) defect that may be caused by czochralski process. Therefore, the quality of the semiconductor cap 202 is improved, thereby improving the device performance formed on the semiconductor cap 202 of the SOI substrate. In addition, the SOI substrate of the disclosure includes dielectric-to-dielectric interface, which has a quality better than heterogeneous bonding interface (e.g., semiconductor-to-dielectric) included in conventional SOI substrate. Further, the dielectrics layers of the SOI substrate were not subjected to implantation process, therefore, defects may be caused by the implantation process are thus avoided.

Figure 5A:
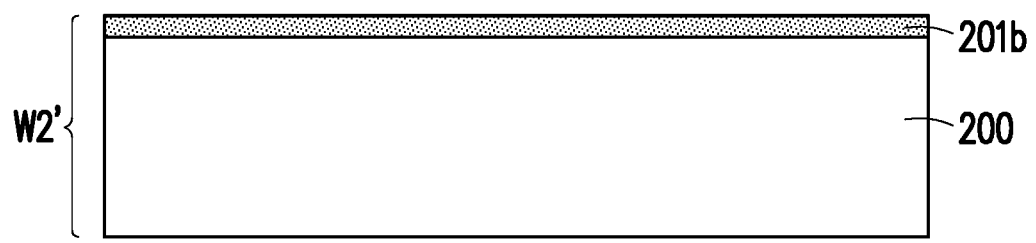
FIG. 5A to FIG. 5B are cross-sectional views illustrating intermediate stages in the manufacturing of a substrate following the process of wafer splitting, in accordance with some embodiments of the disclosure.
Figure 5B:

FIG. 5A to FIG. 5B are cross-sectional views of processing a substrate following the process of wafer splitting, in accordance with some embodiments of the disclosure.

Referring to FIG. 5A and FIG. 5B, in some embodiments, after the wafer splitting process, an annealing process is performed on the wafer structure W2'. The annealing process is similar to that of the wafer structure W1'. In some embodiments, through the annealing process, implant induced defect in the substrate 200 may be completely or almost healed. For example, after the annealing process is performed, the substrate 200 may be free of implant induced defect (e.g., ion remnant), or the substrate 200 includes a very small portion (upper portion adjacent to the buffer layer 201b) having implant induced defect. Thereafter, the buffer layer 201b is removed from the substrate 200 by an etching process, such as dry etching, wet etching, or a combination thereof. In some embodiments, after the buffer layer 201b is removed, a planarization process (e.g., CMP) may be optionally performed to planarize the top surface of the substrate 200. In some embodiments in which the substrate 200 includes a small portion having implant induced defect, the defect portions of the substrate 200 may be removed by the planarization process.

In some embodiments, the substrate 200 may be recycled for forming SOI substrates, and the processes described above may be repeated. For example, the "recycle method" may include repeating the process described in FIG. 2A and FIG. 2D, starting with forming a buffer layer on the substrate 200, thereby forming a wafer structure that is used for the formation of SOI substrate.

In the embodiments of the disclosure, the cleavage plane is defined in the buffer layer instead of the substrate 200, ions for defining cleavage plane are mostly implanted into the buffer layer, therefore, the impact of the implantation process and splitting process on the substrate 200 is minimized. Compared to convention process in which cleavage plane is defined in silicon substrate, in the embodiments of the disclosure, the defect of substrate caused by cleavage plane (e.g., defined by hydrogen ions) is avoided, and the loss of substrate during the fabrication process (e.g., wafer splitting) is minimized or avoided. As such, the recycle times of the substrate 200 are significantly increased, and fabrication cost is saved. In some embodiments, the recycle times of the substrate 200 may be greater than 10.

Figure 6:
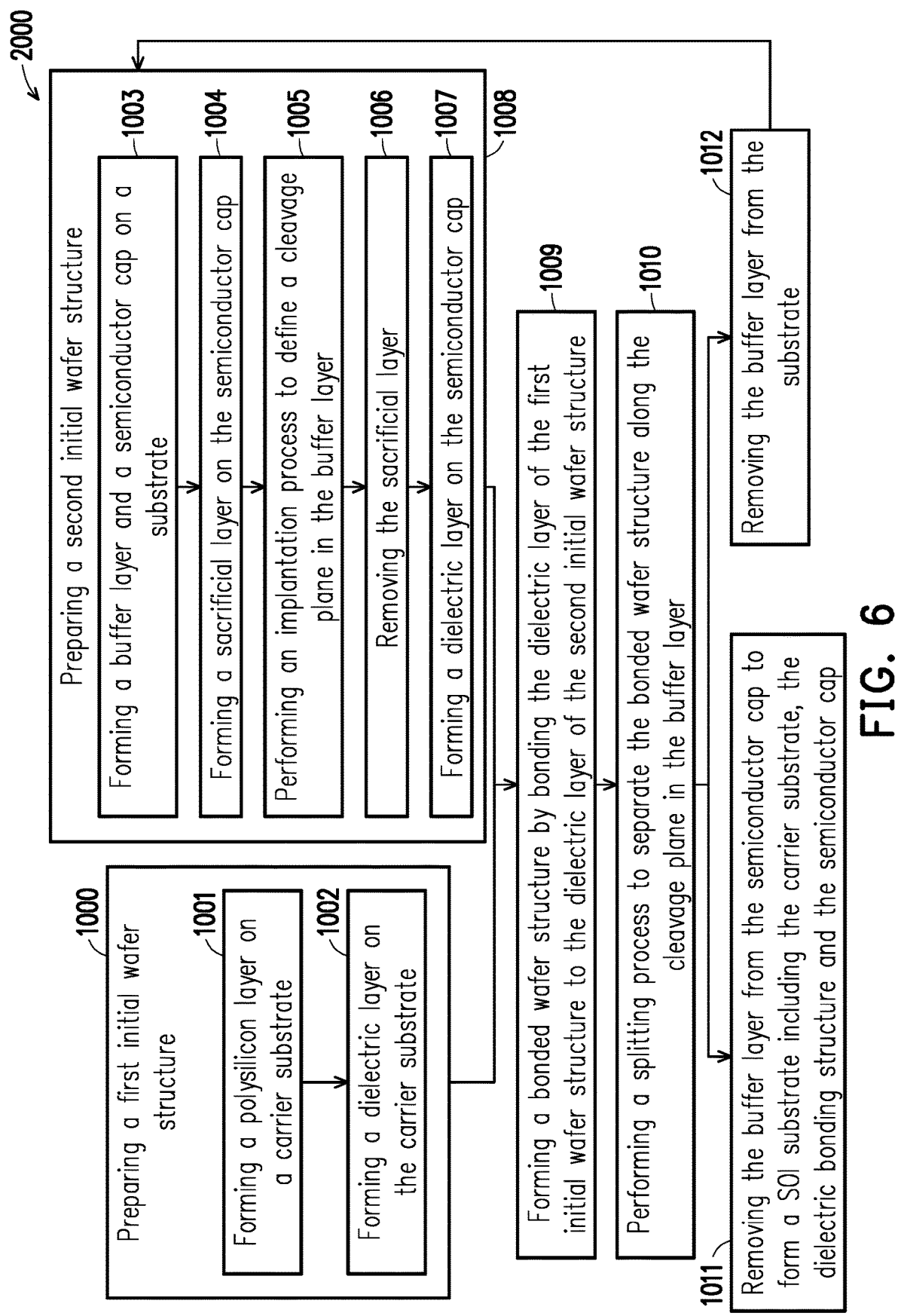
FIG. 6 is a flow chart illustrating a method of forming a SOI substrate according to some embodiments of the disclosure.

FIG. 6 illustrates a flow chart of a method 2000 for forming SOI substrate according to some embodiments of the disclosure. While method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1000, a first initial wafer structure is prepared. The act 1000 may include forming a dielectric layer on a carrier substrate, as shown in act 1002. The act 1000 may optionally include an act 1001 before performing the act 1002. At act 1001, a polysilicon layer is optionally formed on the carrier substrate. FIG. 1A and FIG. 1B illustrate cross-sectional views of some embodiments, corresponding to the act 1001 and 1002, respectively.

At act 1008, a second initial wafer structure is prepared. In some embodiments, the act 1008 includes the acts 1003-1007. At act 1003, a substrate is provided, and a buffer layer and a semiconductor cap are formed on the substrate. FIG. 2A and FIG. 2B illustrate cross-section views of some embodiments corresponding to the act 1003. At act 1004, a sacrificial layer is formed on the semiconductor cap. At act 1005, an implantation process is performed to define a cleavage plane in the buffer layer. FIG. 2C illustrates cross-sectional view of some embodiments corresponding to the acts 1004 and 1005. At act 1006, the sacrificial layer is removed. At act 1007, a dielectric layer is formed on the semiconductor cap. FIG. 2D illustrates cross-sectional view of some embodiments corresponding to the acts 1006 and 1007.

At act 1009, the first initial wafer structure formed at act 1000 and the second initial wafer structure formed at act 1008 are bonded together to form a bonded wafer structure. In some embodiments, the bonding process includes bonding the dielectric layer of the first initial wafer structure to the dielectric layer of the second initial wafer structure. The dielectric layers form a dielectric bonding structure including a dielectric-to-dielectric bonding interface between the dielectric layers. FIG. 3A illustrates cross-sectional view of some embodiments corresponding to the act 1009.

At act 1010, a splitting process is performed to separate the bonded wafer structure along the cleavage plane in the buffer layer. FIG. 3B illustrates cross-sectional view of some embodiments corresponding to the act 1010.

At act 1011, the buffer layer is removed from the semiconductor cap to form a SOI substrate including the carrier substrate, the dielectric bonding structure and the semiconductor cap. FIG. 4A to FIG. 4C illustrate cross-sectional views of some embodiments corresponding to the act 1011.

At act 1012, the buffer layer is removed from the substrate. FIG. 5A to FIG. 5B illustrate cross-sectional views of some embodiments corresponding to the act 1012. In some embodiments, the substrate may be recycled for the process of forming SOI substrate. As shown in FIG. 6, after the buffer layer is removed from the substrate in act 1012, the substrate may be recycled to be used in the act 1008, starting with forming a buffer layer and a semiconductor cap on the substrate after the buffer layer is removed.

In accordance with some embodiments of the disclosure, a method of forming a semiconductor-on-insulator (SOI) substrate includes: forming a first dielectric layer on a first substrate; forming a buffer layer on a second substrate; forming a semiconductor cap on the buffer layer over the second substrate; forming a cleavage plane in the buffer layer; forming a second dielectric layer on the semiconductor cap after forming the cleavage plane; bonding the second dielectric layer on the second substrate to the first dielectric layer on the first substrate; performing a splitting process along the cleavage plane in the buffer layer; removing a first split buffer layer from the semiconductor cap; and removing a second split buffer layer from the second substrate.

In accordance with alternative embodiments of the disclosure, a method of forming a SOI substrate includes forming a first initial wafer structure and forming a second initial wafer structure. The formation of the first initial wafer structure includes forming a first dielectric layer on a first substrate. The formation of the second initial wafer structure include: forming a buffer layer on a second substrate; forming a semiconductor cap on the buffer layer; forming a sacrificial layer on the semiconductor cap; performing an implanting process to implant an implantation species through the sacrificial layer into the buffer layer, so as to define a cleavage plane in the buffer layer; removing the sacrificial layer; and forming a second dielectric layer on the semiconductor cap. The method further includes: bonding the second dielectric layer of the second initial wafer structure to the first dielectric layer of the first initial wafer structure; and performing a wafer splitting process along the cleavage plane in the buffer layer.

In accordance with yet another embodiment of the disclosure, a method of forming a SOI substrate includes the following processes. a bonded wafer structure having a dielectric-to-dielectric interface is formed by a method including: forming a first dielectric layer on a carrier substrate; forming an epitaxial layer embedded in a semiconductor substrate; performing an implantation process to implant an implantation species through the semiconductor substrate into the epitaxial layer, the implantation species define a cleavage plane in the epitaxial layer, wherein the semiconductor substrate is protected while performing the implantation process; forming a second dielectric layer on the semiconductor substrate after performing the implantation process; and bonding the second dielectric layer to the first dielectric layer. A wafer splitting process is performed along the cleavage plane in the epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor-on-insulator (SOI) substrate, comprising:
    forming a first dielectric layer on a first substrate;
    forming a buffer layer on a second substrate;
    forming a semiconductor cap on the buffer layer over the second substrate;
    forming a sacrificial layer on the semiconductor cap;
    forming a cleavage plane in the buffer layer;
    removing the sacrificial layer;
    forming a second dielectric layer on the semiconductor cap after forming the cleavage plane;
    bonding the second dielectric layer on the second substrate to the first dielectric layer on the first substrate;
    performing a splitting process along the cleavage plane in the buffer layer;
    removing a first split buffer layer from the semiconductor cap, wherein after removing the first split buffer layer, the first substrate, a dielectric bonding structure comprising the first dielectric layer and the second dielectric layer, and the semiconductor cap constitute the SOI substrate, wherein the SOI substrate comprises a dielectric-to-dielectric bonding interface between the first dielectric layer and the second dielectric layer; and
    removing a second split buffer layer from the second substrate.

2. The method of claim 1, wherein the first split buffer layer is formed to be thicker than the second split buffer layer.

3. The method of claim 1, further comprising:
    performing an implanting process to implant an implantation species through the sacrificial layer into the buffer layer, so as to define the cleavage plane in the buffer layer.

4. The method of claim 1, wherein the buffer layer comprises silicon germanium.

5. The method of claim 4, wherein the buffer layer further comprises boron.

6. The method of claim 5, wherein the buffer layer further comprises a boron diffusion inhibiter.

7. The method of claim 6, wherein the boron diffusion inhibiter comprises carbon.

8. The method of claim 1, wherein the first dielectric layer is formed by a thermal oxidation process, and the second dielectric layer is performed by a chemical vapor deposition process.

9. The method of claim 1, wherein a vertical distance between the cleavage plane and the second substrate is less than a vertical distance between the cleavage plane and the semiconductor cap.

10. The method of claim 1, wherein the splitting process is induced at the cleavage plane by annealing or mechanical force.

11. A method of forming a SOI substrate, comprising:
    forming a first initial wafer structure, comprising:
    forming a first dielectric layer on a first substrate;
    forming a second initial wafer structure, comprising:
    forming a buffer layer on a second substrate;
    forming a semiconductor cap on the buffer layer;
    forming a sacrificial layer on the semiconductor cap;
    performing an implanting process to implant an implantation species through the sacrificial layer into the buffer layer, so as to define a cleavage plane in the buffer layer, after performing the implantation process, a concentration of the implantation species comprised in the semiconductor cap is less than a concentration of the implantation species comprised in the second substrate;
    removing the sacrificial layer; and
    forming a second dielectric layer on the semiconductor cap;
    bonding the second dielectric layer of the second initial wafer structure to the first dielectric layer of the first initial wafer structure;
    performing a wafer splitting process along the cleavage plane in the buffer layer; and
    after performing the wafer splitting process, performing a post annealing process during which implant induced defects in the semiconductor cap are healed, and the semiconductor cap is free of the implantation species.

12. The method of claim 11, wherein the implanting process is performed such that a vertical distance between the cleavage plane and the second substrate is less than a vertical distance between the cleavage plane and the semiconductor cap.

13. The method of claim 11, wherein the concentration of the implantation species in the semiconductor cap is zero.

14. The method of claim 11, wherein the second dielectric layer formed after the implanting process is free of the implantation species.

15. The method of claim 11, wherein the first substrate comprises a semiconductor substrate and a polysilicon layer formed on the semiconductor substrate.

16. The method of claim 11, wherein performing the wafer splitting process to split the buffer layer into a first split buffer layer on the semiconductor cap and a second split buffer layer on the second substrate.

17. The method of claim 11, wherein the wafer splitting process is induced at the cleavage plane by an annealing process, and the annealing process forms a hydrogen exfoliation layer along the cleavage plane in the buffer layer.

18. A method of forming a SOI substrate, comprising:
    forming a bonded wafer structure having a dielectric-to-dielectric bonding interface, comprising:
    forming a first dielectric layer on a carrier substrate;
    forming a buffer layer embedded in a semiconductor substrate structure, wherein forming the buffer layer embedded in the semiconductor substrate structure comprises:
    providing a substrate;
    performing an epitaxial process to form the buffer layer on the substrate; and
    forming a semiconductor cap on the buffer layer;

forming a sacrificial layer on the semiconductor substrate structure;
performing an implantation process to implant an implantation species through the semiconductor substrate structure into the buffer layer, the implantation species define a cleavage plane in the buffer layer, wherein the semiconductor substrate structure is protected while performing the implantation process;
removing the sacrificial layer;
forming a second dielectric layer on the semiconductor substrate structure after performing the implantation process; and
bonding the second dielectric layer to the first dielectric layer; and
performing a wafer splitting process along the cleavage plane in the buffer layer.

19. The method of claim 18,
wherein the semiconductor substrate structure is protected by the sacrificial layer during the implantation process.

20. The method of claim 18, wherein performing the wafer splitting process to split the buffer layer into a first split buffer layer on the semiconductor cap and a second split buffer layer on the substrate.

* * * * *